United States Patent [19]
Chen et al.

[11] Patent Number: 5,597,442
[45] Date of Patent: Jan. 28, 1997

[54] CHEMICAL/MECHANICAL PLANARIZATION (CMP) ENDPOINT METHOD USING MEASUREMENT OF POLISHING PAD TEMPERATURE

[75] Inventors: Hsi-Chieh Chen, Chu-Tung; Shun-Liang Hsu, Hsin-Chu, both of Taiwan

[73] Assignee: Taiwan Semiconductor Manufacturing Company Ltd., Hsin-Chu, Taiwan

[21] Appl. No.: 543,816

[22] Filed: Oct. 16, 1995

[51] Int. Cl.⁶ .................................. H01L 21/461
[52] U.S. Cl. .................... 156/626.1; 156/636.1; 216/84; 216/85; 451/7; 451/287
[58] Field of Search .................... 156/626.1, 636.1; 216/84, 85, 88, 89; 437/228; 451/6, 7, 41, 53, 287, 288, 289, 290

[56] References Cited

U.S. PATENT DOCUMENTS

| | | | |
|---|---|---|---|
| 4,247,306 | 1/1981 | Berge | 451/7 |
| 4,450,652 | 5/1984 | Walsh | 51/131.4 |
| 5,196,353 | 3/1993 | Sandhu et al. | 437/228 |
| 5,234,868 | 8/1993 | Cote | 437/225 |
| 5,240,552 | 8/1993 | Yu et al. | 156/636 |
| 5,244,527 | 9/1993 | Aoyagi | 156/626.1 |
| 5,308,438 | 5/1994 | Cote et al. | 156/636 |
| 5,337,015 | 8/1994 | Lustig et all | 324/671 |
| 5,413,941 | 5/1995 | Koos et al. | 437/8 |
| 5,499,733 | 3/1996 | Litvak | 216/85 |

FOREIGN PATENT DOCUMENTS

| | | |
|---|---|---|
| 4-72636 | 3/1992 | Japan . |
| 2112547 | 7/1983 | United Kingdom . |

Primary Examiner—R. Bruce Breneman
Assistant Examiner—Anita Alanko
Attorney, Agent, or Firm—George O. Saile

[57] ABSTRACT

An improved and new process for chemical/mechanical planarization (CMP) of a substrate surface, wherein the endpoint for the planarization process is detected by monitoring the temperature of the polishing pad with an infrared temperature measuring device, has been developed. The method allows endpoint to be detected in-situ at the polishing apparatus, without necessity to unload the substrate for visual inspection or performance of specialized, time-consuming, and costly thickness and/or surface topography measurements.

17 Claims, 3 Drawing Sheets

CHEMICAL/MECHANICAL PLANARIZATION (CMP) ENDPOINT METHOD USING MEASUREMENT OF POLISHING PAD TEMPERATURE

BACKGROUND OF THE INVENTION

(1) FIELD OF THE INVENTION

This invention relates to an apparatus and method for determining an endpoint in a chemical/mechanical process for polishing the surface of a semiconductor wafer. More specifically, the invention is directed to the method of endpoint detection when polishing to a planar condition a semiconductor substrate which contains topographic features, resulting from deposited and patterned layers.

(2) DESCRIPTION OF RELATED ART

In the fabrication of semiconductor components, metal conductor lines are used to interconnect the many components in device circuits. As wiring densities in semiconductor circuit chips increase, multiple wiring levels are required to achieve interconnection of the devices, and planarization of the interlevel dielectric becomes a critical step in the fabrication process. The technology requires that the device interconnection lines be formed over a substrate containing device circuitry. These interconnection lines are typically metal or a conductor and serve to electrically interconnect the discrete circuit devices. These metal connecting lines are further insulated from the next interconnection level by thin layers of insulating material formed by, for example, chemical vapor deposition (CVD) of oxide. In order to interconnect metal lines of different wiring levels, holes are formed in the insulating layers to provide electrical access therebetween. In such wiring processes, it is desirable that the insulating layers have a smooth surface topography.

Recently chemical/mechanical polishing (CMP) has been developed for providing smooth insulator topographies. Briefly, the process involves holding and rotating a thin, flat wafer of the semiconductor material against a wetted polishing surface under controlled chemical, pressure, and temperature conditions. A chemical slurry containing a polishing agent, such as alumina or silica, is used as the abrasive material. Additionally, the chemical slurry contains selected chemicals which etch various surfaces of the wafer during processing. The combination of mechanical and chemical removal of material during polishing results in superior planarization of the polished surface. In this process it is important to remove a sufficient amount of material to provide a smooth surface, without removing an excessive amount of underlying materials. Thus, a precise etch endpoint detection technique is needed.

In the past, endpoint has been detected by interrupting the CMP process, removing the wafer from the polishing apparatus, and physically examining the wafer surface by techniques which ascertain film thickness and/or surface topography. If the wafer does not meet specifications, it must be loaded back into the polishing apparatus for further planarization. If excess material has been removed, the wafer may not meet specifications and will be substandard. This endpoint detection method is time consuming, unreliable, and costly. Therefore, numerous improvements to endpoint detection during CMP have been invented, as shown in the following patents.

U.S. Pat. No. 5,234,868 entitled "Method For Determining Planarization Endpoint During Chemical-Mechanical Polishing" granted Aug. 10, 1993 to William J. Cote describes a monitor structure surrounded by a moat. The moat causes polish removal to proceed faster at the monitor structure than at regions not surrounded by a moat. Polishing proceeds until the top of the monitor structure is exposed and results in a layer of planarized insulation above the metal pattern not surrounded by a moat. Visual inspection is employed to determine exposure of the top of the monitor structure. Or, alternately, monitoring is done electrically by detecting an electrical connection between the top of a metal monitor structure and the polishing pad.

U.S. Pat. No. 5,240,552 entitled "Chemical Mechanical Planarization (CMP) of a Semiconductor Wafer Using Acoustical Waves For In-Situ End Point Detection" granted Aug. 31, 1993 to Chris C. Yu et al directs acoustical waves at the wafer during CMP and through analysis of the reflected waveform controls the planarization process.

U.S. Pat. No. 5,308,438 entitled "Endpoint Detection Apparatus and Method For Chemical/Mechanical Polishing" granted May 3, 1994 to William J. Cote et al describes an endpoint detection method in which the power required to maintain a set rotational speed in a motor rotating the substrate is monitored. Endpoint is detectable because the power required to maintain a set rotational speed in a motor rotating the substrate significantly drops when the difficult to polish layer is removed.

U.S. Pat. No. 5,337,015 entitled "In-situ Endpoint Detection Method and Apparatus for Chemical-Mechanical Polishing Using Low Amplitude Input Voltage" granted Aug. 9, 1994 to Naftali E. Lustig et al utilizes electrodes built into the polishing pad, and a high frequency, low-voltage signal, and detection means as a method for measuring the thickness of a dielectric layer being polished.

U.S. Pat. No. 5,413,941 entitled "Optical End Point Detection Methods in Semiconductor Planarizing Polishing Processes" granted May 9, 1995 to Daniel A. Koos et al describes a method for endpoint detection for polishing by impinging laser light onto the substrate being polished and measuring the reflected light. The intensity of the reflected light is a measure of the planarity of the polished surface.

U.S. Pat. No. 5,196,353 entitled "Method For Controlling a Semiconductor (CMP) Process By Measuring a Surface Temperature and Developing a Thermal Image of the Wafer" granted Mar. 23, 1993 to Gurtej S. Sandhu et al describes the use of infrared radiation detection to measure the surface temperature of a semiconductor wafer during a polishing process.

The present invention is directed to a novel method and apparatus of in-situ endpoint detection performed during a chemical/mechanical planarization (CMP) process using infrared monitoring of the temperature of the polishing pad.

SUMMARY OF THE INVENTION

One object of the present invention is to provide an improved and new process for chemical/mechanical planarization (CMP) of a substrate surface, wherein the endpoint for the planarization process is detected by monitoring the temperature of the polishing pad with an infrared temperature measuring device.

Another object of the present invention is to provide a new and improved process of CMP planarization in which endpoint is detected in-situ at the polishing apparatus, without necessity to unload the substrate for visual inspection or performance of specialized, time-consuming, and costly thickness and/or surface topography measurements.

The present invention is directed to a novel method and apparatus of in-situ endpoint detection performed during a semiconductor chemical/mechanical planarization (CMP) process in real time using infrared measurement of the temperature of the polishing pad during the planarization process. In an illustrative embodiment, apparatus for carrying out the method of the invention includes: a wafer carrier and rotating polishing platen for chemically/mechanically planarizing (CMP) the semiconductor wafer, a rotating polishing pad, means of controlling the temperature of a chemical/mechanical polishing slurry, means of dispensing the chemical/mechanical polishing slurry onto the polishing pad, an infrared temperature detection device for monitoring the temperature of the polishing pad at a selected position during the polishing operation, and a means to terminate the polishing process when the monitored temperature decreases by a preselected increment.

BRIEF DESCRIPTION OF THE DRAWINGS

The object and other advantages of this invention are best described in the preferred embodiment with reference to the attached drawings that include.

DESCRIPTION OF THE PREFERRED EMBODIMENTS

The method of planarizing the surface of a semiconductor substrate, using chemical/mechanical polishing (CMP), and the new and improved method of endpoint detection will now be described in detail. The method can be used for planarizing insulator surfaces, such as silicon oxide or silicon nitride, deposited by chemical vapor deposition or other means, over semiconductor devices and/or conductor interconnection wiring patterns.

Figure 1A:
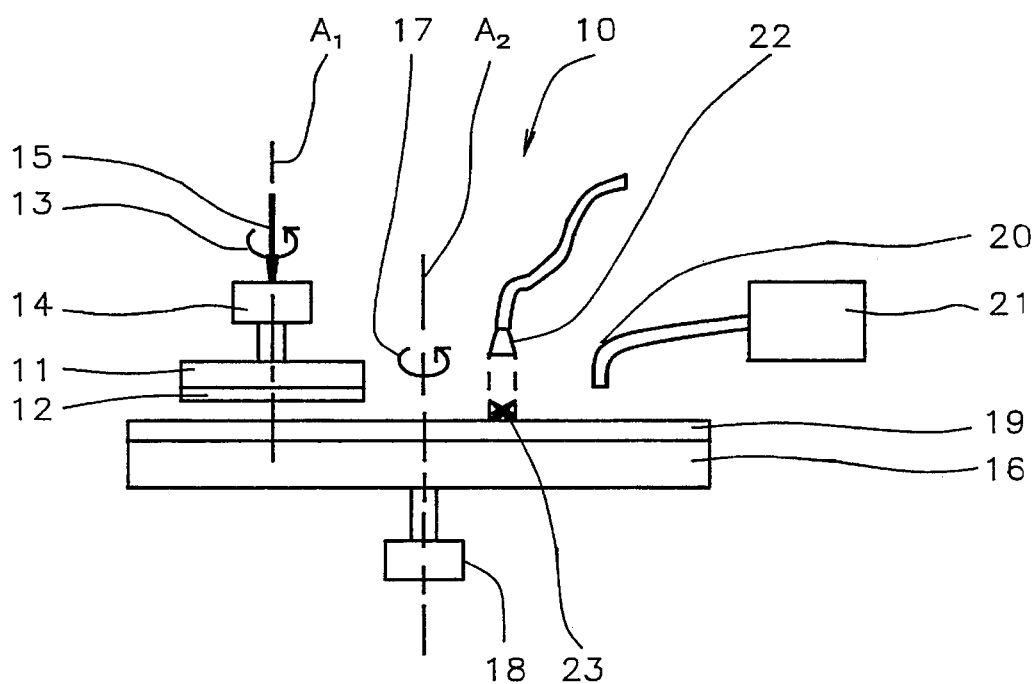
FIG. 1A, which schematically, in cross-sectional representation, illustrates a polishing apparatus, used in accordance with the method of the invention.
Figure 1B:
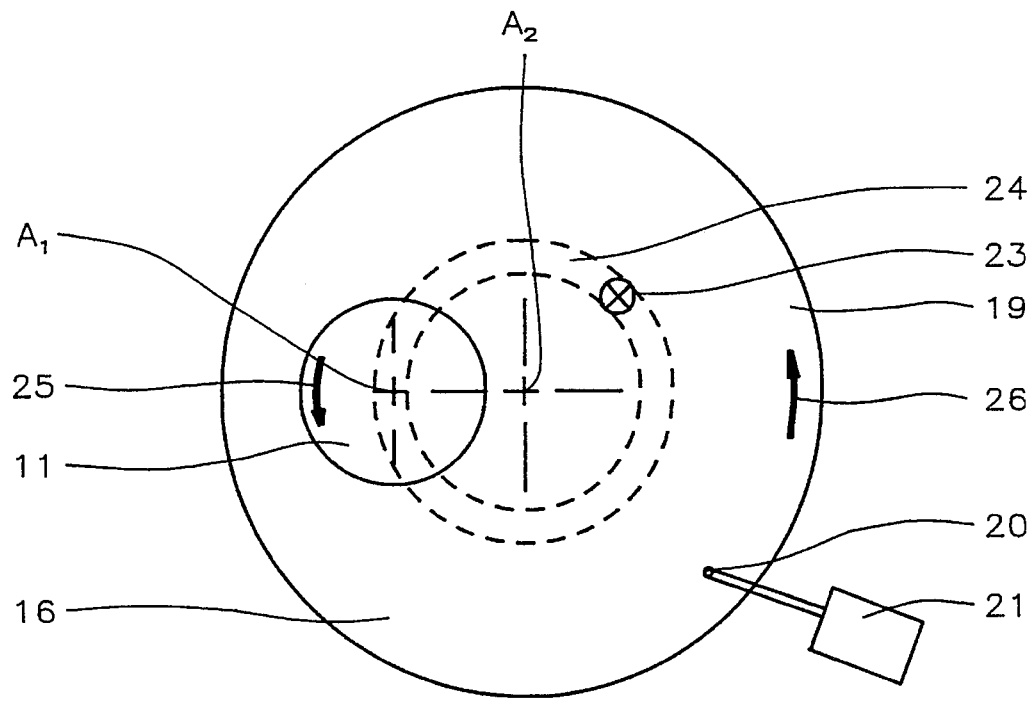
FIG. 1B, which is a top view of the apparatus illustrated in FIG. 1A.

FIGS. 1A and 1B are schematic views of a chemical/mechanical planarization (CMP) apparatus for use in accordance with the method of the invention. In FIG. 1A, schematically, in cross-sectional representation, the CMP apparatus is generally designated as 10. The CMP apparatus, 10, includes a wafer carrier, 11, for holding a semiconductor wafer, 12. The wafer carrier, 11, is mounted for continuous rotation about axis, A1, in a direction indicated by arrow, 13, by a drive motor, 14. The wafer carrier, 11, is adapted so that a force indicated by arrow, 15, is exerted on semiconductor wafer, 12. The CMP apparatus, 10, also includes a polishing platen, 16, mounted for continuous rotation about axis, A2, in a direction indicated by arrow, 17, by a drive motor, 18. A polishing pad, 19, formed of a material such as blown polyurethane, is mounted to the polishing platen. A polishing slurry containing an abrasive fluid, such as silica or alumina abrasive particles suspended in either a basic or an acidic solution, is dispensed onto the polishing pad, 19, through a conduit, 20, from a temperature controlled reservoir, 21. An infrared radiation detection device, 22, is mounted so as to detect infrared radiation emitted from an area, 23, designated by X. The area, 23, traces an annular ring, 24, on the polishing pad, 19, as shown in FIG. 1B, due to the continuous rotation of the polishing pad, 19. The location of area, 23, is within the portion of the polishing pad, 19, that abrades the semiconductor wafer, 12, during rotation of the polishing pad, 19.

In FIG. 1B, which schematically is a top view of the CMP apparatus, 10, shown in FIG. 1A, the key elements are shown. Wafer carrier, 11, is shown to rotate in a direction indicated by arrow, 25, about an axis, A1. Polishing platen, 16, is shown to rotate in a direction indicated by arrow, 26, about an axis, A2. The polishing slurry is dispensed onto the polishing pad, 19, through conduit, 20, from a temperature controlled reservoir, 21. The infrared detection device, 22, (shown in FIG. 1A), receives infrared radiation emitted from an area, 23, designated X. The area, 23, describes a portion of the area of the polishing pad, 19, within the annular ring, 24.

Figure 2:
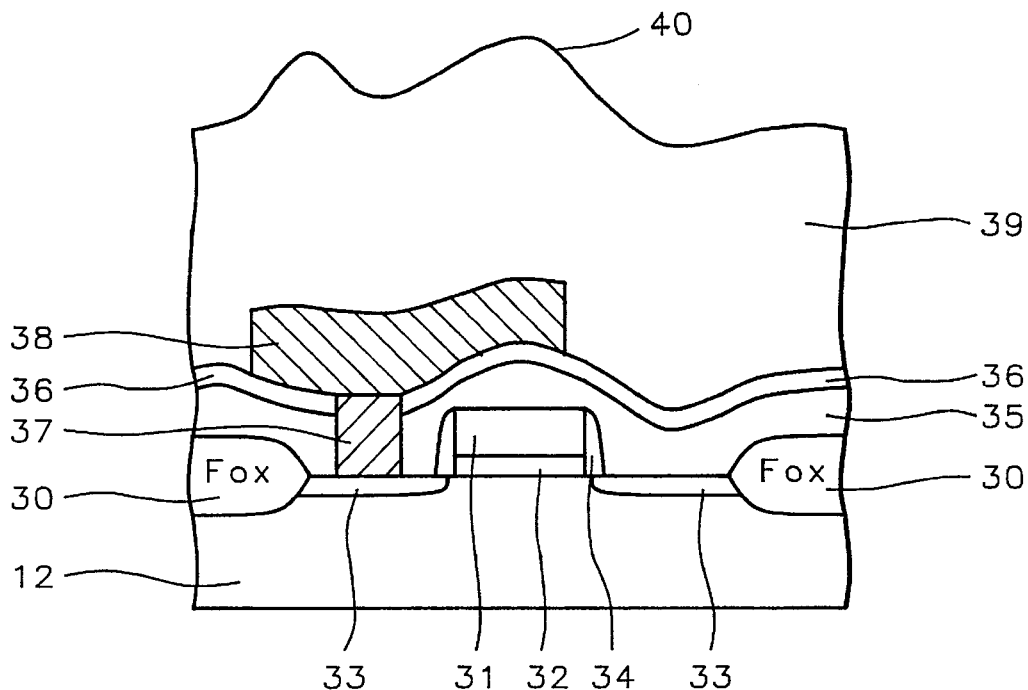
FIGS. 2–3, which schematically, in cross-sectional representation, illustrate planarization of the surface of a semiconductor circuit by chemical/mechanical polishing.
Figure 3:
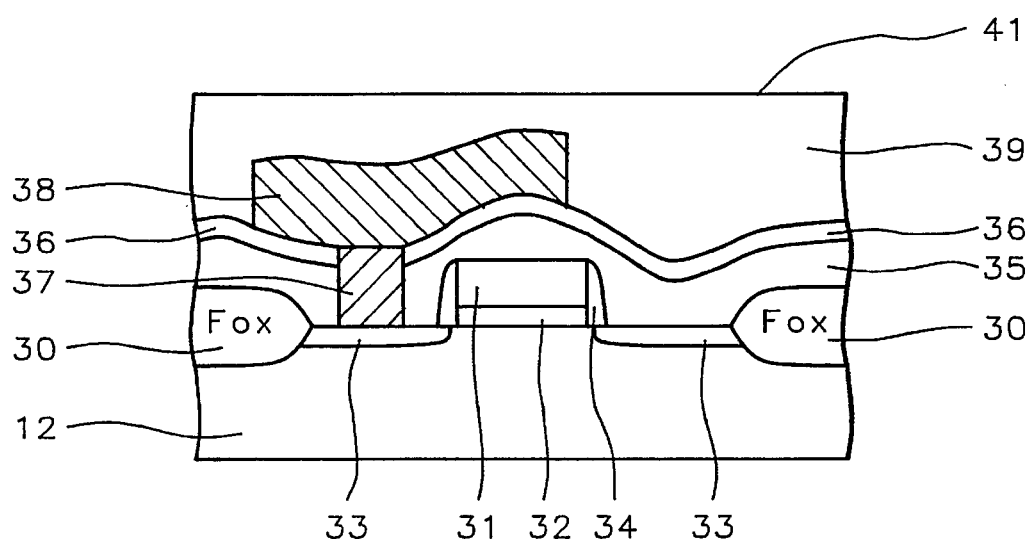

FIGS. 2 and 3, schematially in cross-sectional representation, show the chemical/mechanical planarization (CMP) of a semiconductor wafer containing a metallized MOSFET device onto which has been deposited an overlayer of silicon oxide. A typical NFET, (N-type Field Effect Transistor) device, as shown in FIG. 2, consists of a semiconductor wafer, 12, composed of P-type, single crystal silicon with a <100> orientation; a thick field oxide region, 30, (FOX); a polysilicon gate, 31; gate oxide, 32; source and drain regions, 33; sidewall spacers, 34; LPCVD deposited layers of silicon oxide, 35, and silicon nitride, 36; interlevel connecting plug, 37; conducting interconnection pattern, 38; and PECVD deposited overlayer of silicon oxide, 39. Deposition of the PECVD layer of silicon oxide, 39, is substantially conformal to the underlying topography and results in a rough surface topography, 40. The dielectric material may be composed of silicon oxide deposited using PECVD processing, at a temperature between about 300° to 500° C., to a thickness between about 15,000 to 30,000 Angstroms, using TEOS at a flow between about 100 to 1000 sccm. The conducting material may be composed of aluminum having a thickness between about 4000 to 12,000 Angstroms. Planarization of the surface topography, 40, shown in FIG. 2, is performed using chemical/mechanical polishing (CMP) in an apparatus as generally illustrated in FIGS. 1A and 1B and results in a substantially planar oxide surface, 41, as shown in FIG. 3.

The method of endpoint detection during chemical/mechanical (CMP) planarization of the rough surface topography, 40, shown in FIG. 2, will now be described in detail. Referring to FIGS. 1A and 1B, a polishing slurry consisting of silica and KOH, contained in reservoir, 21, is controlled in the temperature range between about 20° to 22° C., and is dispensed through conduit, 20, so as to saturate polishing pad, 19. An infrared radiation detection device, 22, measures the temperature of an area, 23, on the polishing pad, 19. The semiconductor wafer, 12, is placed in the polishing apparatus, 10, with the silicon oxide layer, 39, face down against the polishing pad, 19. The polishing platen motor, 18, has its speed set at between about 30 to 80 rpm and the wafer carrier drive motor, 14, is set to rotate at a speed of between about 5 to 30 rpm. The wafer carrier, 11, is set to apply a pressure of between about 6 to 12 psi between the wafer and the polishing pad, through the application of force, 15.

Figure 4:
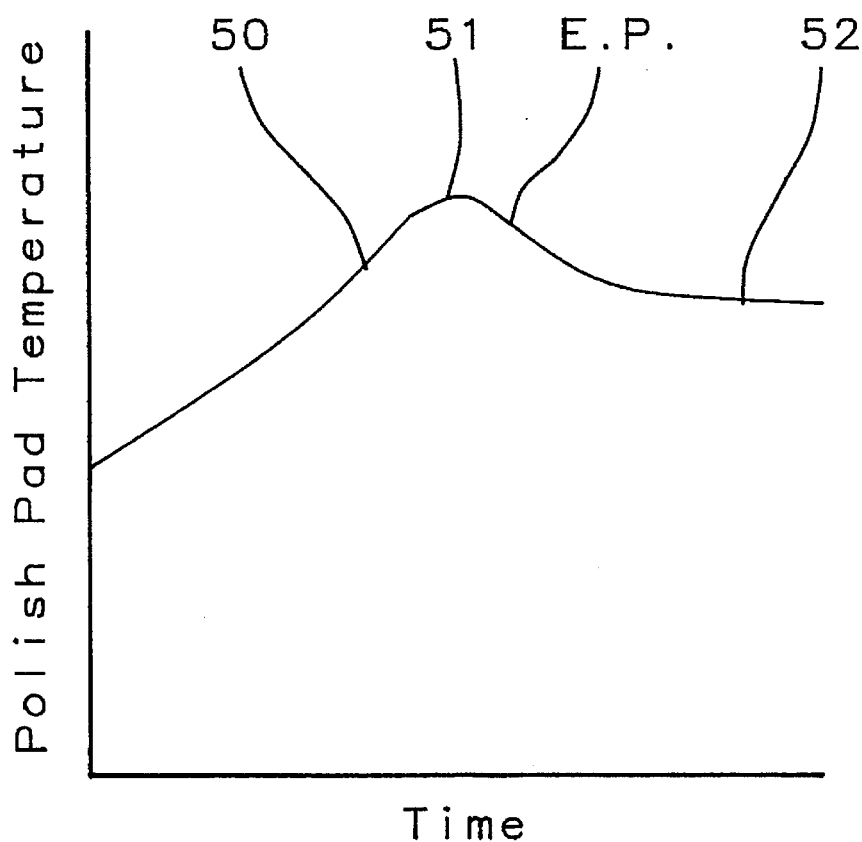
FIG. 4, which shows the behavior of infrared detected polishing pad temperature versus time, when using chemical/mechanical polishing to planarize the surface of a semiconductor substrate, with the desired endpoint indicated.

The method of using the measured temperature of the polishing pad is depicted in FIG. 4, which shows the behavior of infrared detected polishing pad temperature versus time, when using chemical/mechanical polishing to planarize rough oxide surface topography. The temperature of the polishing pad increases, indicated by 50, due to the friction between the fibers of the pad, the abrading particles in the polishing slurry, and the rough oxide surface being polished. The pad temperature increases with time and reaches a maximum, 51, due to the local high pressure between pad and rough topographic projections initially present on the oxide surface. As CMP proceeds the projecting topography is smoothed, local high pressure is reduced, and the pad temperature drops to level 52. Endpoint, (E.P.), is selected as the time at which the polishing pad temperature decreases by 2° C., 53, below the maximum temperature reached by the polishing pad during the planarization process.

While the invention has been particularly shown and described with reference to the preferred embodiments thereof, it will be understood by those skilled in the art that various changes in form and details may be made without departing from the spirit and scope of the invention.

What is claimed is:

1. A method of chemical/mechanical planarization (CMP) of an article comprising:

planarizing the article by holding the article on a rotating platen against a rotating polishing pad in the presence of a polishing slurry;

controlling the temperature of the polishing slurry in the temperature range between about 20° to 22° C.;

dispensing said temperature controlled slurry onto said rotating polishing pad;

measuring by infrared detection means the temperature of said polishing pad at a selected polishing pad location which is abrading the surface of said article; and terminating the planarization process when said polishing pad temperature decreases by at least 2° C. below the maximum temperature reached by said polishing pad during the planarization process.

2. The method of claim 1, wherein said article is a semiconductor wafer.

3. The method of claim 2, wherein said semiconductor wafer is coated with an oxide layer.

4. The method of claim 1, wherein said polishing slurry comprises silica and KOH, controlled in the temperature range between about 20° to 22° C.

5. The method of claim 1, wherein said temperature of said polishing pad is measured in the temperature range between about 30° to 50° C.

6. The method of claim 1, wherein said temperature of said polishing pad is measured by an infrared temperature detecting device.

7. A method for fabricating a planarized layer of dielectric material on a semiconductor substrate containing a structure, comprising the steps of:

providing said structure on said semiconductor substrate;

depositing a layer of dielectric material onto said semiconductor substrate containing said structure;

planarizing said layer of dielectric material by holding said semiconductor substrate on a rotating platen against a rotating polishing pad in the presence of a polishing slurry and applied pressure between the platen and polishing pad;

controlling the temperature of the polishing slurry in the temperature range between about 20° to 22° C.;

dispensing the temperature controlled slurry into the rotating polishing pad;

measuring by infrared detection means the temperature of the polishing pad at a location which is abrading the surface of said layer of dielectric material; and terminating the planarizing process when said polishing pad temperature decreases by at least 2° C. below the maximum temperature reached by said polishing pad during the planarization process.

8. The method of claim 7, wherein said structure is an active device.

9. The method of claim 7, wherein said structure is an interconnection pattern of conducting material.

10. The method of claim 7, wherein said structure comprises both active devices and an interconnection pattern of conducting material.

11. The method of claim 8, wherein said active device is a NFET or PFET MOS device.

12. The method of claim 9, wherein said interconnection pattern of conducting material, is aluminum having a thickness between about 4000 to 12,000 Angstroms.

13. The method of claim 7, wherein said layer of dielectric material is silicon oxide deposited using PECVD processing, at a temperature between about 300° to 500° C., to a thickness between about 15,000 to 30,000 Angstroms, using TEOS at a flow between about 100 to 1000 sccm.

14. The method of claim 7, wherein said polishing slurry comprises silica and KOH, controlled in the temperature range between about 20° to 22° C.

15. The method of claim 7, wherein said rotating polishing pad is rotated in a range between about 30 to 80 rpm.

16. The method of claim 7, wherein said rotating platen is rotated in a range between about 5 to 30 rpm.

17. The method of claim 7, wherein said applied pressure between the platen and polishing pad is in a range between about 6 to 12 psi.

* * * * *